United States Patent [19]

Adlhoch et al.

[11] Patent Number: 4,586,168
[45] Date of Patent: Apr. 29, 1986

[54] DUAL PORT MEMORY SENSE AMPLIFIER ISOLATION

[75] Inventors: Richard H. Adlhoch, Tempe; James Ward, Mesa, both of Ariz.

[73] Assignee: Motorola, Inc., Schaumburg, Ill.

[21] Appl. No.: 560,628

[22] Filed: Dec. 12, 1983

[51] Int. Cl.[4] .............................................. G11C 13/00
[52] U.S. Cl. .................................... 365/189; 365/156
[58] Field of Search ............... 365/189, 154, 156, 190, 365/206

[56] References Cited
U.S. PATENT DOCUMENTS
4,165,540  8/1979  Vinot .

Primary Examiner—Terrell W. Fears
Attorney, Agent, or Firm—Joe E. Barbee

[57] ABSTRACT

A dual port memory has been provided which allows read and write operations by separate data processors during a read cycle of one of the processors. A method of accomplishing this is provided by shortening the column drive signal to disconnect the column line from the sense amplifier once the sense amplifier has latched the data being read. Write circuitry can then be enabled to write into the memory cell which has just been read by the sense amplifier.

8 Claims, 3 Drawing Figures

DUAL PORT MEMORY SENSE AMPLIFIER ISOLATION

The present invention relates, in general, to a dual port memory, and more particularly, to apparatus and method for reading and writing into a dual port memory cell.

Typically, a dual port memory contains a standard memory cell but has a multiplexed I/O so that two different data processors can use the same memory. Such a dual port memory requires separate read and write cycles for each data processor connected to the I/O. Such a system does not permit reading by one data processor and writing by another data processor during a single read cycle.

Accordingly, it is an object of the present invention to provide an improved dual port memory and method.

Another object of the present invention is to permit almost simultaneous read and write of a memory storage cell.

Yet another object of the present invention is to provide a memory wherein a sense amplifier is disconnected from a storage cell as soon as data from the storage cell is latched in the sense amplifier so that the storage cell can be written into during the same memory cycle.

SUMMARY OF THE INVENTION

The above and other objects and advantages of the present invention are provided by a memory having a storage cell accessible by two data processors. The storage cell is controllably coupled to column lines and the column lines are in turn controllably coupled to a sense amplifier. Once data is latched in the sense amplifier the column lines are disconnected from the sense amplifier so that a separate write circuit can then write new data into the storage cell without interference from the sense amplifier.

DETAILED DESCRIPTION OF THE DRAWINGS

In random access memory (RAM) designs, a sense amplifier is used to determine the contents of a memory cell during a read operation. During this read operation the sense amplifier is connected to the bit sense lines of the memory. Since the bit sense lines are also used to write data into the memory, having the sense amplifier connected to the bit sense lines may interfere with the writing of data into the memory if such writing was attempted during a read cycle. For many RAMs this does not pose a problem, since the read and write functions are separate and do not take place simultaneously. However, in a multi-ported memory (one which can be asynchronously accessed by two or more data processors with overlapping cycles), it would be desirable to allow one processor to write data to the memory during the same memory cycle that another processor is reading data from the memory. Using a conventional design, if a read cycle is initiated by data processor A first, and during this read cycle, a write cycle is begun by processor B the connection of the sense amplifier to the memory cell by processor A may prevent the writing to the same memory cell by processor B. This is because the same amplifier provides a drive to the memory cell comparable to that of the write driver.

Figure 1:
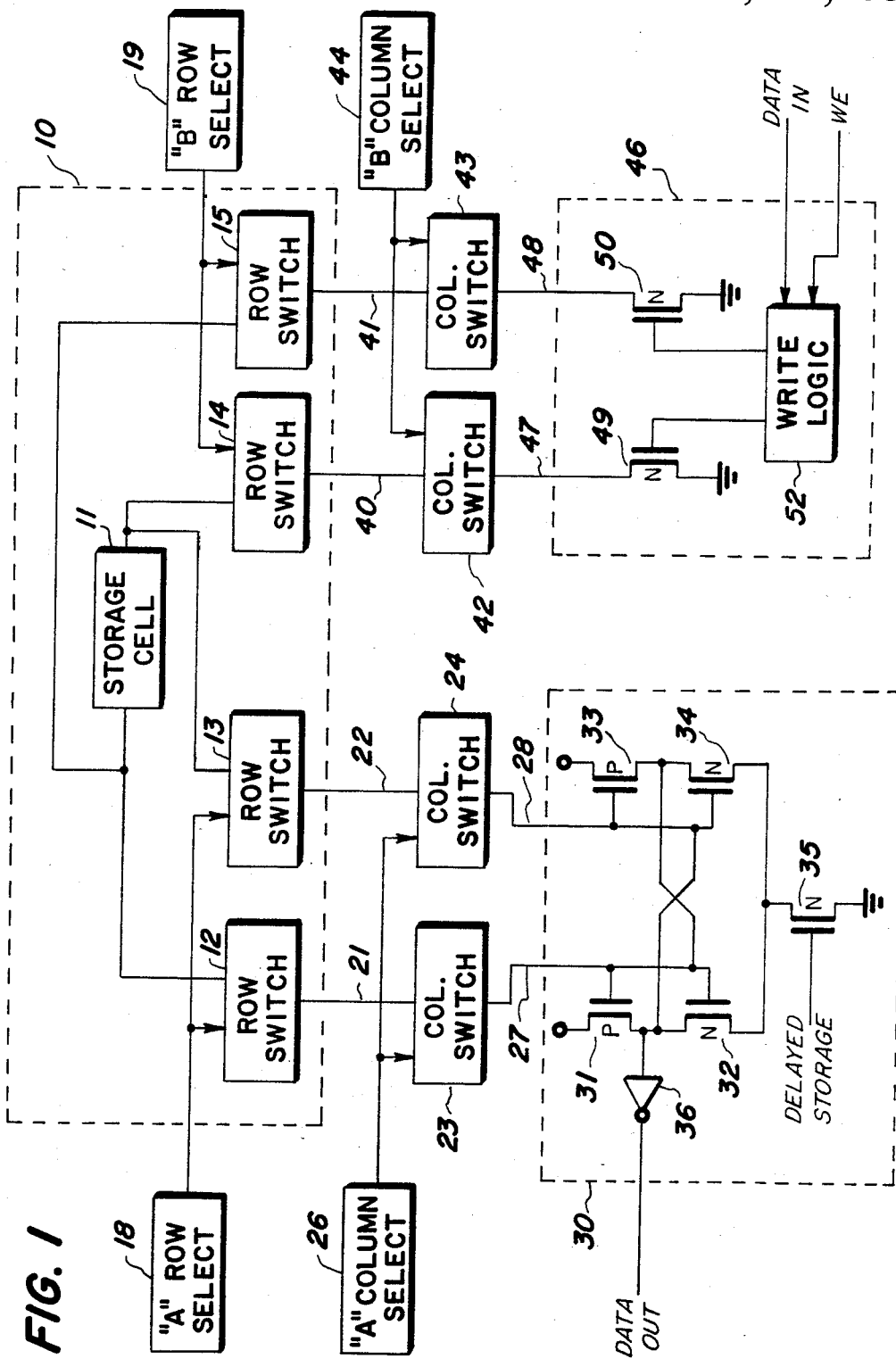
FIG. 1 illustrates in schematic and block diagram form a portion of a memory system embodying the present invention.

One solution to this problem could be to change the design of the sense amplifier to prevent it from providing an output drive to the memory. This however would increase the complexity of the sense amplifier and might cause the sense amplifier to draw more current. A preferred solution is illustrated in FIG. 1 and uses a conventional, simple sense amplifier design. However, a second write circuit is added to the memory system and the timing duration of the column select signal is modified to shut off the column select switches after the sense amplifier has latched the data that was in the memory cell. With the sense amplifier disconnected from the memory cell, the other processor may write into the memory cell without any interference from the latched sense amplifier even though the read cycle has not ended.

FIG. 1 illustrates an embodiment of the present invention using a conventional, simple sense amplifier. A memory cell 10, shown in dotted lines, has a storage cell 11 with a first access line connected to a row switch 12 and a row switch 15. A second access line to storage cell 11 is connected to row switch 13 and row switch 14. Row switches 12 and 13 are controlled by a signal provided by "A" row select gate 18. Row switches 14 and 15 are controlled by a signal from "B" row select gate 19. Row switch 12 is connected to column line 21 and row switch 13 is connected to column line 22. Column lines 21 and 22 are connected to column switches 23 and 24, respectively. Column switches 23 and 24 are controlled by a control signal from "A" column select gate 26. Column switch 23 is also connected to sense amplifier input 27 and column switch 24 is connected to sense amplifier input 28. The sense amplifier is enclosed within dotted lines 30 and has a pair of cross-coupled N-channel transistors 32 and 34. Transistor 32 has its drain electrode coupled to a power supply terminal by a P-channel transistor 31. P-channel transistor 31 has its gate electrode connected to the gate electrode of transistor 32 and the drain electrode of transistor 34. The drain electrode of transistor 34 is coupled to a power supply terminal by a P-channel transistor 33. Transistor 33 has its gate electrode connected to sense amplifier input 28, the gate electrode of transistor 34, and the drain electrode of transistor 32. The drain of transistor 32 is also connected to an input of inverter 36 which provides the data output for sense amplifier 30. The source electrodes of transistors 32 and 34 are connected to a second power supply terminal, illustrated as ground, by an N-channel transistor 35. Transistor 35 has its gate electrode connected to a delayed strobe control signal. In a preferred embodiment, sense amplifier inputs 27 and 28 would also be connected to write circuitry which is not shown to avoid overcrowding the drawing. This interconnection of the sense amplifier and the write circuitry will be more apparent hereinafter.

Row switch 14 is coupled to a column switch 42 by a column line 40. Row switch 15 is coupled to a column switch 43 by a column line 41. Column switches 42 and 43 are controlled by a control signal provided by "B" column select gate 44. Column switches 42 and 43 are coupled to write circuitry 46 by lines 47 and 48. Line 47 is connected to a drain electrode of an N-channel transistor 49 which has its source electrode connected to ground. Line 48 is connected to a drain electrode of an N-channel transistor 50 which has its source connected to ground. The gate electrodes of transistors 49 and 50 are connected to a write logic circuit 52. Write logic circuit 52 receives a data input signal and a write enable, WE, control signal.

If a read and write command come up at the same time and the write command gains control, then the new data written into the memory cell will be read out by the sense amplifier activated by the read command. However, if the read command gains control then "A" row select gate 18 will enable row switches 12 and 13 to connect storage cell 11 to column lines 21 and 22. At the same time "A" column select gate 26 enables column switches 23 and 24 to provide the data from storage cell 11 to sense amplifier 30. The delayed strobe signal enables sense amplifier 30 by enabling transistor 35. The delayed strobe signal occurs slightly after the row drive signal, provided by row select gate 18, reaches a steady-state condition. Soon after sense amplifier 30 is enabled the data from storage cell 11 will be latched by cross-coupled transistors 32 and 34. Once this occurs the column drive signal is removed from column switches 23 and 24 thereby decoupling column lines 21 and 22 from sense amplifier 30. Once sense amplifier 30 is disconnected, then write circuitry 46 can be enabled to provide a write signal into storage cell 11. This is done by providing a row drive signal from "B" row select gate 19 to row switches 14 and 15 and providing a column drive signal from "B" column select gate 44 to column switches 42 and 43. Write logic circuit 52 will receive the write enable signal, WE, and the input data so that either transistor 49 or 50 will be enabled. When row switches 14 and 15 are enabled along with column switches 42 and 43 then lines 47 and 48 are directly connected to storage cell 11.

A shortened column drive signal which results in a short read pulse, is sufficient provided that it is long enough for sense amplifier 30 to still have time to latch up even under worst case conditions.

Figure 2:
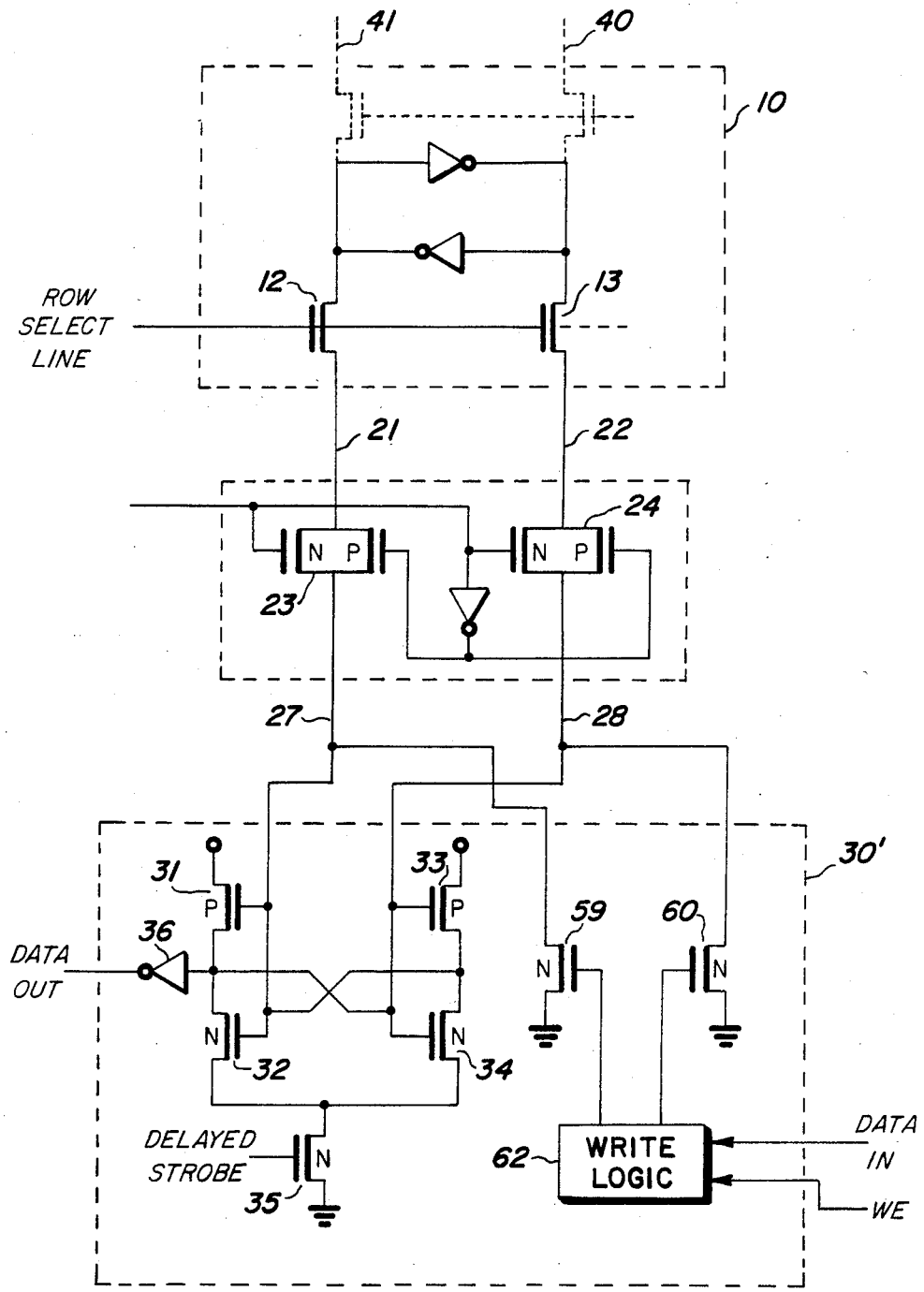
FIG. 2 illustrates schematically an embodiment of the present invention.

A portion of the circuitry of FIG. 1 is shown schematically in FIG. 2. Memory cell 10 is shown as having storage cell 11 comprised of two front-to-back interconnected inverters. Row switch 12 is illustrated as an N-channel transistor 12 and row switch 13 is illustrated as being an N-channel transistor 13. Row switches 14 and 15 are also illustrated by transistors which are shown in phantom. Since the circuitry connected to column lines 40 and 41 is not necessary to understand, schematically, the invention it is not shown. Column switches 23 and 24 are illustrated as CMOS transmission gates 23 and 24. Transmission gates 23 and 24 each have an N-channel and a P-channel transistor connected in parallel. The column drive control signal is connected to the gate electrode of the N-channel transistors and to an inverter. The output of the inverter is connected to the gate electrodes of the P-channel transistors in column switches 23 and 24. Transmission gates 23 and 24 are connected to lines 27 and 28, respectively, which are in turn connected to sense amplifier and write circuitry 30'. The operation of the sense amplifier and its interconnection has been explained hereinbefore as has the operation of the write circuitry. The write circuitry includes two N-channel transistors 59 and 60 which have their gate electrodes controlled by write logic circuitry 62. Write logic circuitry 62 is enabled by write enable signal, WE, to provide the data input to memory cell 10. The sense amplifier and write circuitry 30' shown in FIG. 2, in greater detail than shown in FIG. 1, would be used within both dotted enclosures 30 and 46 of FIG. 1. This allows both processor "A" and processor "B" to have complete read/write capability with memory cell 10.

Figure 3:
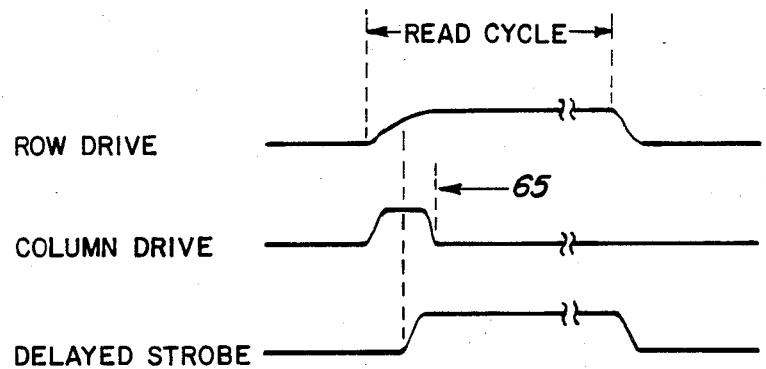
FIG. 3 shows some timing waveforms useful in understanding the operation of the present invention.

FIG. 3 shows the control signal relationship during a read cycle. In the present invention, the row drive signal is a standard row drive signal while the column drive signal has been shortened to terminate at 65. The delayed strobe is shown as occurring slightly after the row drive signal reaches a steady-state condition and continuing for the duration of the read cycle. Accordingly, the only change to the timing relationship is to shorten the column drive signal. Previously the column drive signal would have had the same duration as the row drive signal.

By now it should be appreciated that there has been provided a true multi-port RAM cell which can have read and write capability by different processors during a single memory cycle. The invention is illustrated as having a short column drive signal as opposed to a shortened row drive signal since for the present memory system it was simpler to shorten the column drive signal than shorten the row drive signal. Also, the column line responds faster than the row line since the column line has less capacitive loading.

We claim:

1. A memory having dual read and write capability, comprising: a storage cell having a true signal line and a complement signal line coupled thereto; first means for controllably coupling the true and complement signal lines from the storage cell to bit sense lines; a sense amplifier for receiving data from the bit sense lines and temporarily latching the data therein; second means for controllably coupling the bit sense lines to the sense amplifier; third means for controllably coupling the true and complement signal lines from the storage cell to access lines; circuitry for writing data into the storage cell; and fourth means for controllably coupling the access lines to the circuitry for writing.

2. The memory of claim 1 wherein the first and third means are separate row select switches and each of the first and third means is controlled by separate control signals, and wherein the second and fourth means are separate column select switches and each of the second and fourth means are controlled by separate control signals.

3. The memory of claim 2 wherein the row select switches and the column select switches are transistors.

4. The memory of claim 2 wherein the circuitry for writing is some write logic which receives data to be stored in the storage cell.

5. A method of accessing a storage cell within a memory wherein the storage cell has dual read and write capability, comprising: commencing a read cycle and enabling a first row line coupled to the storage cell and a first column line coupled to the storage cell; enabling a sense amplifier coupled to the first column line; latching data from the storage cell in the sense amplifier; disabling the first column line before the end of the read cycle; enabling a second row line and a second column; and writing data into the storage cell thereby reading and writing data in the storage cell during a single cycle.

6. The method of claim 5 wherein enabling a first column line enables a true and a complement data line, and enabling a second column line includes enabling a true and a complement data line.

7. A memory system having a dual port storage cell comprising: a storage cell having first and second access lines; first row select means for coupling the first access lines to first bit lines; second row select means for coupling the second access lines to second bit lines; a first sense amplifier and write circuitry; a second sense amplifier and write circuitry; first column select means for coupling the first bit lines to the first sense amplifier and write circuitry; and second column select means for coupling the second bit lines to the second sense amplifier and write circuitry.

8. A dual port memory having capability of read and write operations by separate data processors during a read cycle of one of the data processors, comprising: a dual port memory cell; a first sense amplifier and a first write circuit both cooperatively coupled to one set of column lines of the dual port memory cell; first controllable means for coupling the dual port memory cell to the first sense amplifier and the first write circuit; a second sense amplifier and a second write circuit both cooperatively coupled to a second set of column lines of the dual port memory cell; second controllable means for coupling the dual port memory cell to the second sense amplifier and the second write circuit wherein the second controllable means can be enabled during the same read cycle that the first controllable means is enabled.

* * * * *